(12) United States Patent
Regan et al.

(10) Patent No.: US 9,768,041 B2
(45) Date of Patent: Sep. 19, 2017

(54) COLLECTION CHAMBER APPARATUS TO SEPARATE MULTIPLE FLUIDS DURING THE SEMICONDUCTOR WAFER PROCESSING CYCLE

(71) Applicant: VEECO PRECISION SURFACE PROCESSING LLC, Horsham, PA (US)

(72) Inventors: Ray Regan, Horsham, PA (US); Herman Itzkowitz, Bala Cynwyd, PA (US); William Gilbert Breingan, Media, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 70 days.

(21) Appl. No.: 14/457,645

(22) Filed: Aug. 12, 2014

(65) Prior Publication Data
US 2015/0040952 A1    Feb. 12, 2015

Related U.S. Application Data

(60) Provisional application No. 61/864,895, filed on Aug. 12, 2013.

(51) Int. Cl.
*H01L 21/67* (2006.01)
*H01L 21/687* (2006.01)

(52) U.S. Cl.
CPC .... *H01L 21/67075* (2013.01); *H01L 21/6708* (2013.01); *H01L 21/67051* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 5,997,653 A | 12/1999 | Yamasaka | |
| 6,589,338 B1 * | 7/2003 | Nakamori | H01L 21/67051 118/50 |
| 6,793,769 B2 | 9/2004 | Kajino et al. | |
| 6,810,888 B2 | 11/2004 | Tsuchiya et al. | |
| 7,122,084 B2 | 10/2006 | Hohenwarter | |
| 7,467,635 B2 | 12/2008 | Satoshi et al. | |
| 7,584,760 B2 * | 9/2009 | Miya | B08B 17/00 134/137 |

(Continued)

FOREIGN PATENT DOCUMENTS

| | | |
|---|---|---|
| JP | 59-23517 | 2/1984 |
| JP | 4-34902 | 8/1992 |

(Continued)

*Primary Examiner* — Michael Barr
*Assistant Examiner* — Cristi Tate-Sims
(74) *Attorney, Agent, or Firm* — Leason Ellis LLP

(57) ABSTRACT

The collection chamber apparatus acts to separate multiple fluids during the wafer processing cycle. Round, fluid collection trays surround the round wafer to collect each individual fluid, recycling them for later reuse. The trays move up and down by use of air cylinders and stack into each other to prevent cross contamination of the other fluids. Two opposing pistons (air cylinders) lift the trays in pairs to form fluid collection chambers. Each collection chamber has a unique drain which enters a separation manifold, flowing into separate tanks for later reuse.

29 Claims, 12 Drawing Sheets

(56) References Cited

U.S. PATENT DOCUMENTS

| | | |
|---|---|---|
| 7,681,581 B2* | 3/2010 | Rose ................ H01L 21/67017 134/151 |
| 7,722,736 B2 | 5/2010 | Miya |
| 7,958,898 B2 | 6/2011 | Yoshida |
| 8,109,282 B2 | 2/2012 | Miya et al. |
| 8,485,204 B2* | 7/2013 | Obweger .......... H01L 21/68785 134/104.2 |
| 8,501,025 B2 | 8/2013 | Hashizume et al. |
| 8,544,483 B2 | 10/2013 | Collins et al. |
| 8,656,936 B2 | 2/2014 | Collins et al. |
| 8,684,015 B2 | 4/2014 | Lauerhaas et al. |
| 8,721,834 B2 | 5/2014 | Koo et al. |
| 8,845,815 B2* | 9/2014 | Ogata ................ H01L 21/67034 118/319 |
| 8,899,246 B2* | 12/2014 | Plazonic .......... H01L 21/67051 134/104.2 |
| 8,926,788 B2 | 1/2015 | Hohenwarter |
| 8,955,529 B2 | 2/2015 | Hohenwarter |
| 9,431,276 B2 | 8/2016 | Miya et al. |
| 2003/0170988 A1 | 9/2003 | Izumi et al. |
| 2004/0040177 A1 | 3/2004 | Izumi et al. |
| 2004/0050491 A1 | 3/2004 | Miya et al. |
| 2004/0226655 A1 | 11/2004 | Kajino et al. |
| 2005/0274400 A1* | 12/2005 | Chan .................... G03F 7/3092 134/94.1 |
| 2007/0212884 A1* | 9/2007 | Yamamoto .............. G03F 7/11 438/694 |
| 2008/0053493 A1* | 3/2008 | Kimura .............. H01L 21/6708 134/104.4 |
| 2008/0078428 A1 | 4/2008 | Yoshida |
| 2008/0142051 A1 | 6/2008 | Hashizume |
| 2009/0090391 A1 | 4/2009 | Edamoto |
| 2012/0067847 A1* | 3/2012 | Sakurai ............. H01L 21/31111 216/83 |
| 2012/0186275 A1 | 7/2012 | Kato et al. |
| 2013/0256273 A1 | 10/2013 | Miura et al. |
| 2013/0291905 A1 | 11/2013 | Hashizume et al. |
| 2013/0327365 A1 | 12/2013 | Sato |
| 2014/0174483 A1 | 6/2014 | Miya et al. |
| 2014/0202989 A1 | 7/2014 | Kishimoto et al. |
| 2014/0261162 A1 | 9/2014 | Yamaguchi |
| 2014/0331927 A1 | 11/2014 | Nakano et al. |
| 2015/0075571 A1 | 3/2015 | Miura |
| 2015/0090301 A1 | 4/2015 | Higuchi et al. |
| 2015/0114561 A1 | 4/2015 | Higashijima et al. |
| 2015/0200087 A1 | 7/2015 | Kobayashi |
| 2015/0243543 A1 | 8/2015 | Schwarzenbacher et al. |
| 2015/0262848 A1 | 9/2015 | Sano et al. |
| 2015/0340251 A1 | 11/2015 | Wakita et al. |
| 2016/0016206 A1 | 1/2016 | Osada et al. |
| 2016/0045938 A1 | 2/2016 | Aomatsu et al. |
| 2016/0059274 A1 | 3/2016 | Miya et al. |

FOREIGN PATENT DOCUMENTS

| | | |
|---|---|---|
| JP | 11-87294 | 3/1999 |
| JP | 3555724 | 8/2004 |
| JP | 2004-265910 | 9/2004 |
| JP | 5155035 | 2/2013 |
| JP | 5421610 | 2/2014 |

* cited by examiner

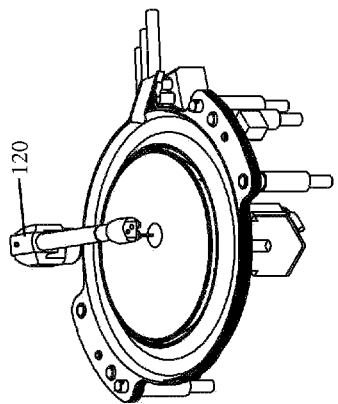
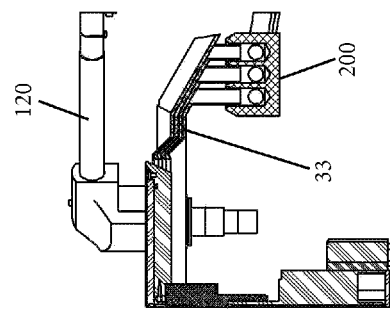
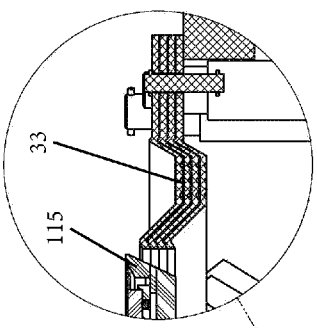
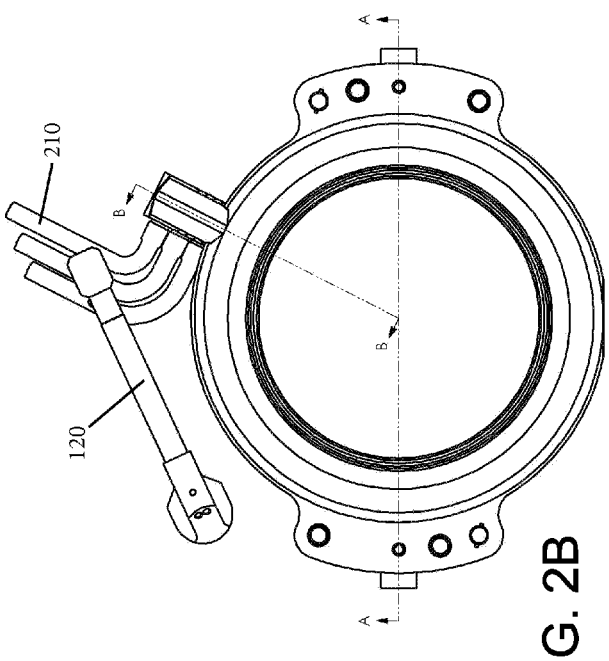
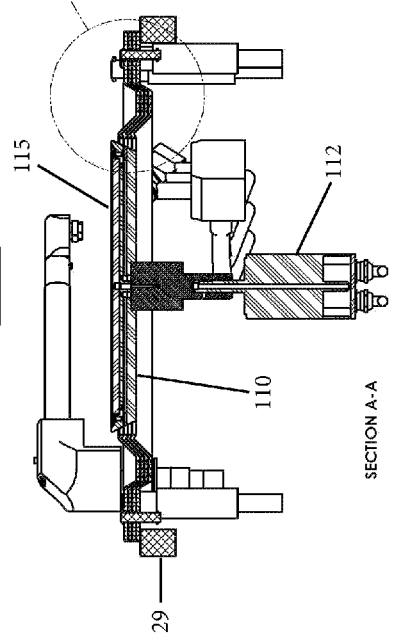

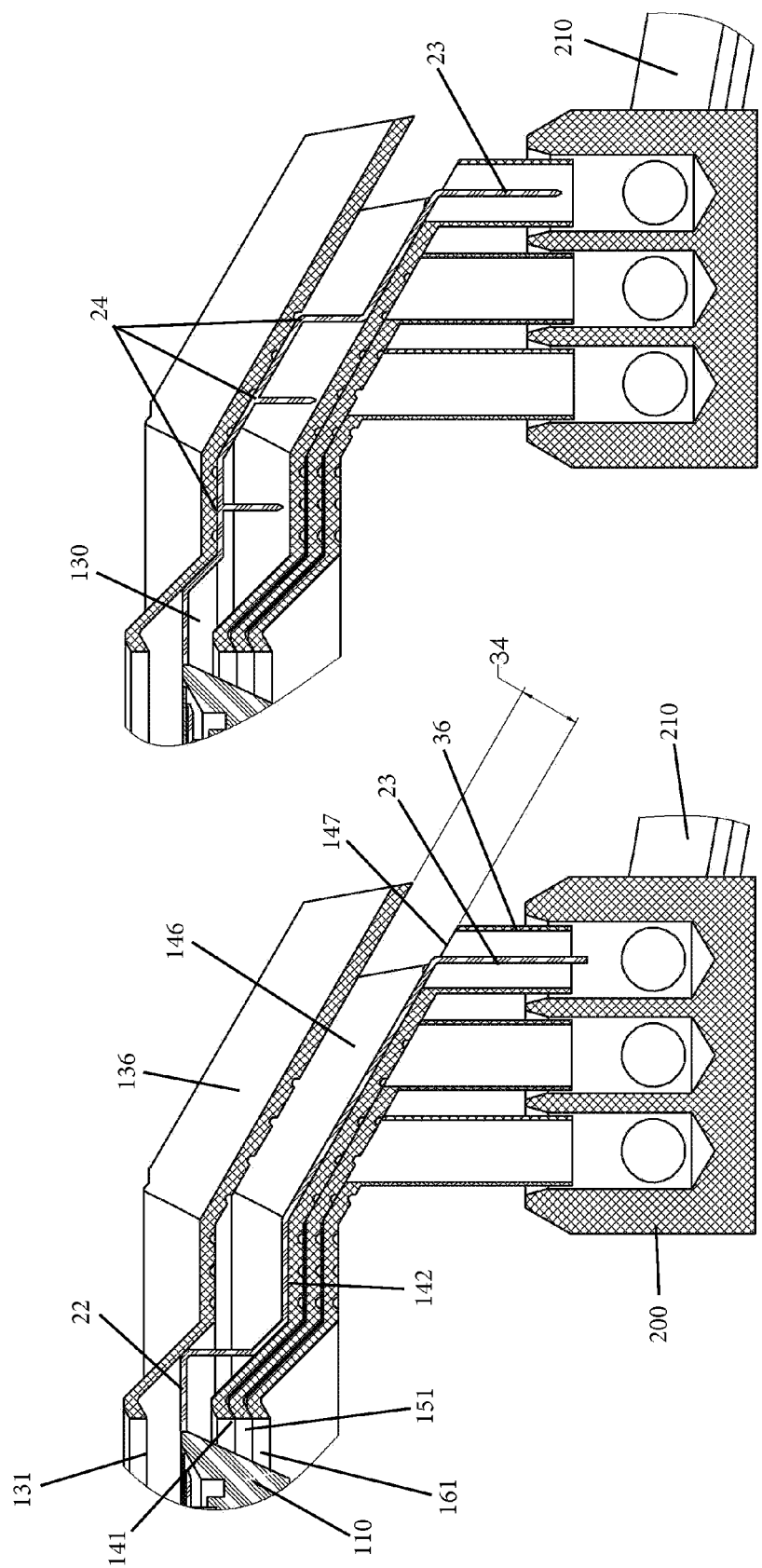

COLLECTION CHAMBER APPARATUS TO SEPARATE MULTIPLE FLUIDS DURING THE SEMICONDUCTOR WAFER PROCESSING CYCLE

CROSS-REFERENCE TO RELATED APPLICATION

The present invention claims the benefit of U.S. patent application Ser. No. 61/864,895, filed Aug. 12, 2013, which is hereby incorporated by reference in its entirety.

TECHNICAL FIELD

The present invention is generally directed to wafer processing equipment and more particularly, to a collection chamber apparatus that provides a means to separate and collect multiple different fluids for reuse during wafer processing.

BACKGROUND

This invention relates particularly to silicon wafer processing where multiple fluids are used during a process to clean, etch or do other wet process operations. The fluids are often expensive and it is desirable to reuse them to exhaustion.

Normal wafer processing employs one collection chamber to separate a special fluid from the waste drain and enable recirculation of the fluid.

The object of this invention is to have multiple, independent collection chambers, with the ability to separate multiple different fluids for recirculation and reuse.

SUMMARY

According to the present invention, a collection chamber apparatus (fluid collecting device) is composed of multiple (n+1) round collection trays which stack and seal into each other when not in use and form multiple (n) unique collection chambers and drain systems, as required. The specific example shown has four (4) collection trays for three (3) unique collection chambers.

The collection trays move into the designated position by way of an opposing pair of vertical air cylinders.

The tops of the air cylinders have a stepped shoulder designed to separate and vertically position two trays at one time.

The two trays form a collection chamber centered on the wafer's edge. The other trays stack into each other in all positions to prevent fluid cross contamination.

As the motor spins the wafer, centrifugal force propels the fluid outward. The fluid leaves the wafers outside edge, striking the angled wall of the upper tray, which deflects the fluid into the lower tray. The lower tray has a drain spout which directs the fluid into a manifold separator. The manifold separator directs each fluid into a discrete tank (not shown) for further reuse.

For the rinse process, the trays are closed to eliminate the possibility of water being incorporated into the fluid streams.

BRIEF DESCRIPTION OF THE DRAWING FIGURES

FIG. 2A is a perspective view showing four collection trays of the apparatus in a stacked, load wafer position;

FIG. 2B is a top plan view of the apparatus;

FIG. 2C is a cross-sectional view taken along the line A-A of FIG. 2B;

FIG. 2D is an enlarged cross-section of a portion of the stacked collection trays shown in FIG. 2C;

FIG. 2E is a cross-sectional view taken along the line B-B of FIG. 2B;

FIG. 3B shows a cross-section through a drain of the collection chamber in the same position as FIG. 3A, with a defined fluid path being delineated;

FIG. 3C is same cross-section as FIG. 3A, showing an alternate fluid path and multiple underside drip grooves for routing fluid;

DETAILED DESCRIPTION OF CERTAIN EMBODIMENTS

Figure 1:
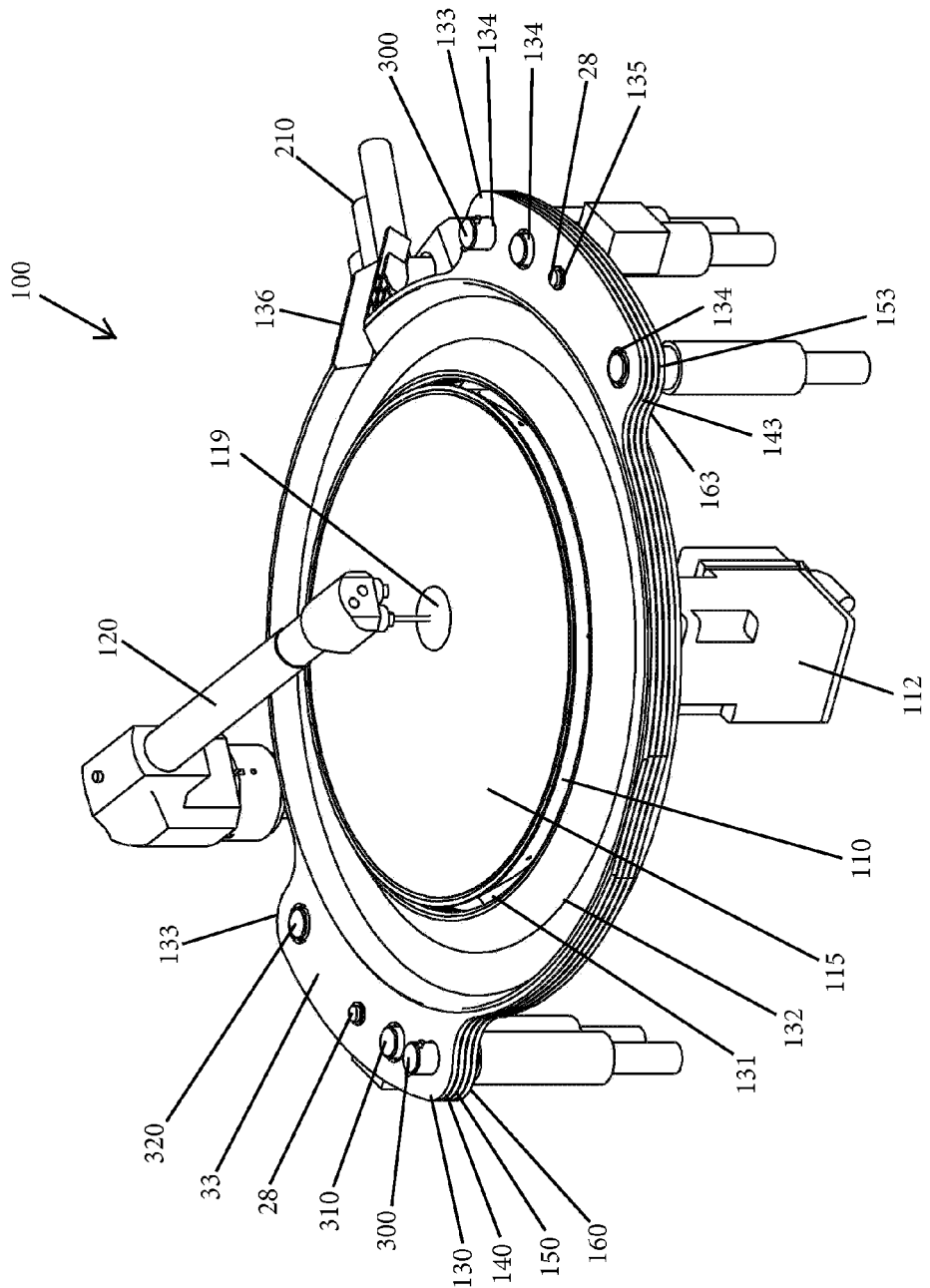
FIG. 1 is an isometric overview of a collection chamber apparatus in accordance with the present invention.

FIG. 1 is an overview of a collection chamber apparatus 100 of the present invention showing collection trays 130, 140, 150, 160 in a stacked, load wafer position 33 (see FIGS. 2 and 2A for additional clarity), in which a wafer 115 can be added or removed. The four trays surround the wafer 115. It will be understood that the proceeding discussion is merely exemplary of one implementation of the present invention and not limiting of the scope of the present invention since other implementations, as discussed below, are possible.

Figure 6:
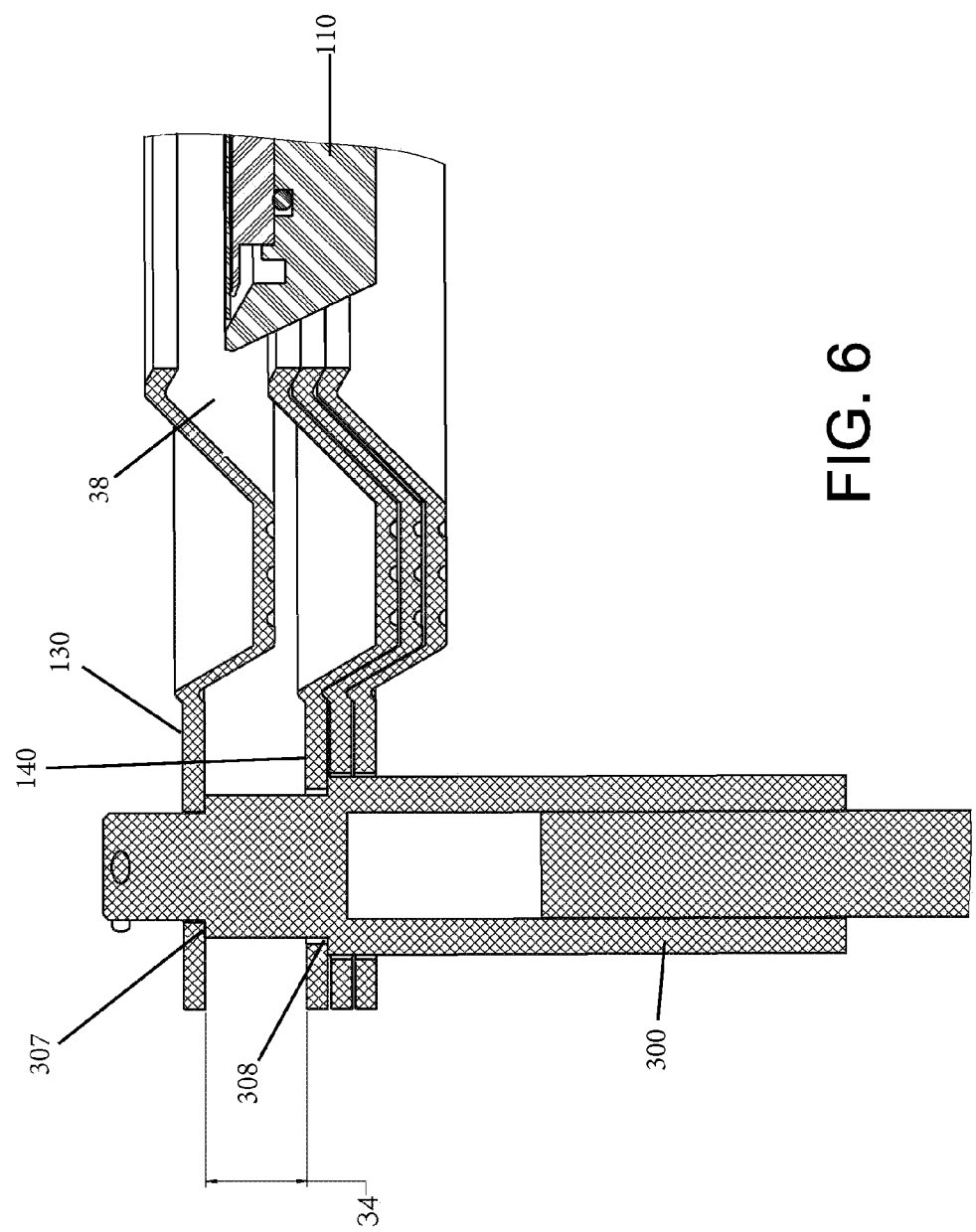
FIG. 6 shows a cross-section through air cylinder and the collection trays depicting how one air cylinder lifts two trays into a predetermined position and provides the correct chamber gap that defines the collection chamber space.

A first fluid separating position will follow as an example of the typical description of operation, for each of the three fluids. Referring to FIGS. 3 and 6 and according to one mode of operation, a pair of pistons 300 (e.g., air cylinders) lift the collection trays 130, 140 forming a first collection chamber identified by the legend 34 (i.e., the gap (distance) between the plates). FIG. 6 shows in more detail the unique piston design which both lifts trays 130, 140 into vertical level 38, and forms the desired collection chamber gap 34 by way of shoulders 307 and 308. In particular, when the pistons 300 are actuated, a first region thereof passes through all of the aligned openings 134, 144, 154, 164 formed in the collection trays; a second region thereof passes only through the openings 144, 154, 164 and a third region thereof only passes through the openings 154, 164. When the pistons 300 complete their extended stroke, the underside of the collection tray 130 seats on shoulder 307 and the underside of the collection tray 140 seats on shoulder 308. The gap 34 (collection chamber) can be controlled and defined by the distance between the shoulders 307, 308 and the thickness of the trays and further, as discussed below, the gap distance can be controlled and defined by pin 28

Next, referring back to FIG. 3A, a motor 112 rotates a wafer 115 located on the spin chuck 110, a dispense arm 120 then centers over the wafer 115 and dispenses the first fluid in the process. The motor 112 increases RPM's to spread fluid over the wafers surface, excess fluid 22 is slung by centrifugal force off the peripheral edge of the spin chuck 110 and onto the underside of the slopped wall of tray 130, refer to FIG. 3B. Per fluid path 22, gravity drops the fluid into the collection tray 140 (e.g., into the collection track thereof), where it flows into the outlet port 146 and the fluid conduit member 147 and finally into a manifold 200. From there the fluid flows into the drain tube 210 and ends up in a discrete tank (not shown) for storage and reuse, where it is dispensed during the next wafer cycle.

FIG. 3C shows an alternate fluid path 30, in which the fluid 23 can run down the underside of tray 130 and multiple drip grooves 24 are included to stop the flow and direct the fluid down into the intended collection tray 140 (which is disposed below tray 130).

Figure 3A:
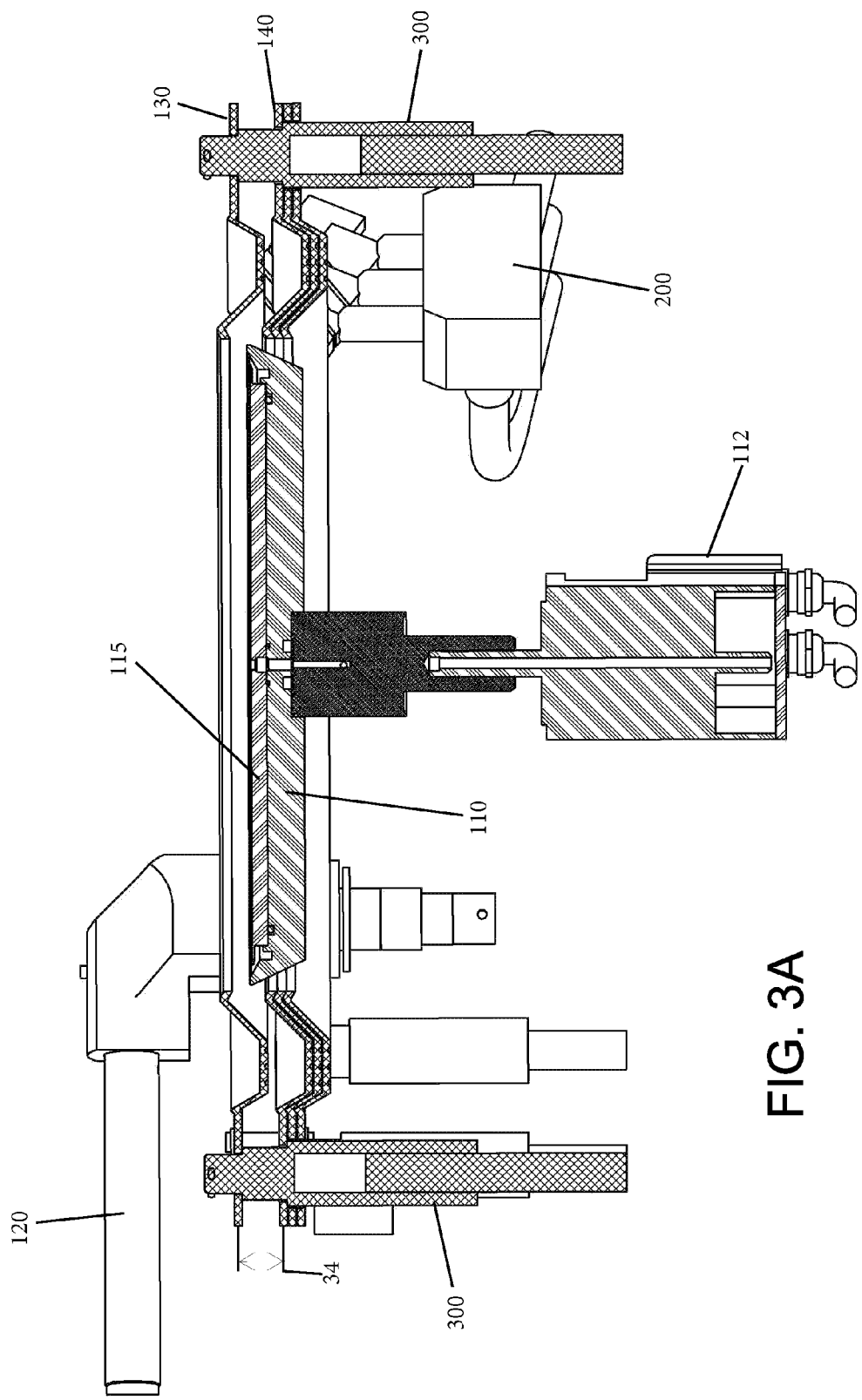
FIG. 3A is a cross-sectional view through the apparatus, with the collection chamber being in a first fluid collection position.
Figure 3D:
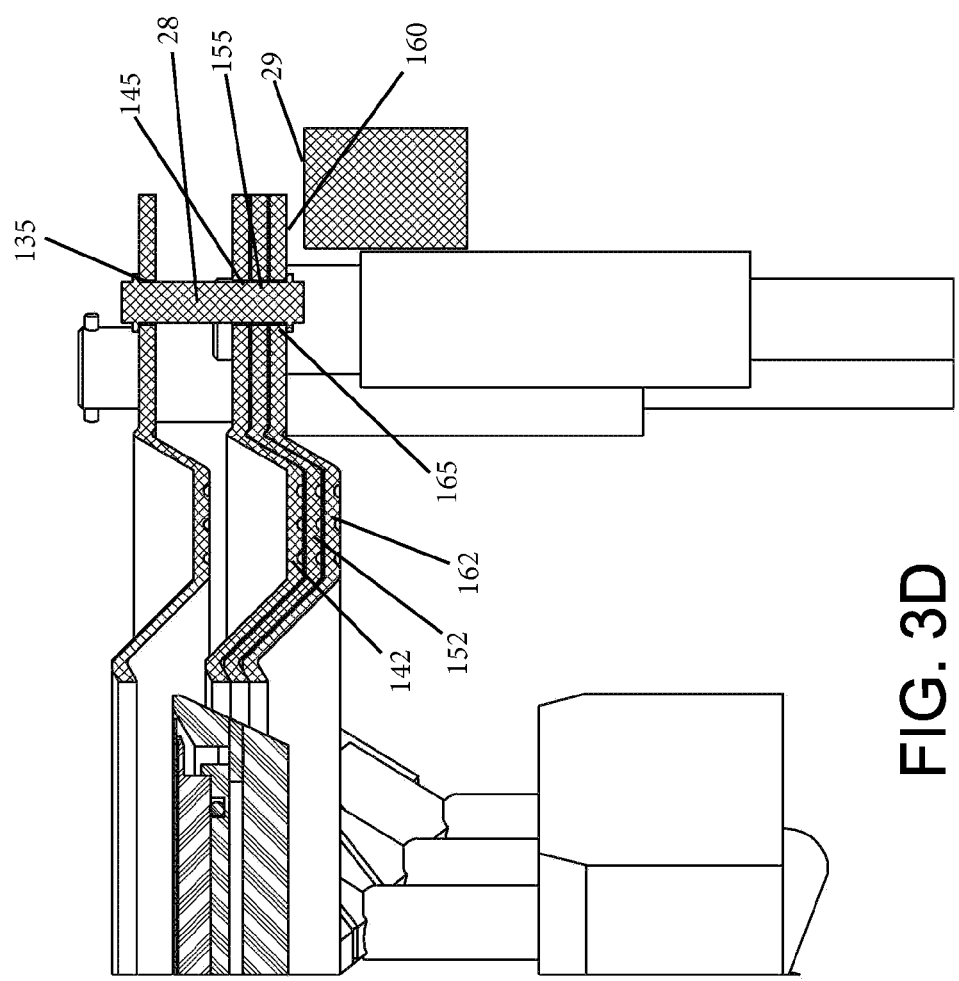
FIG. 3D is a cross-section showing a lift pin that constrains movement of the collection trays and a rest on which the collection tray seats.

FIG. 3D shows a cross-section through a lift pin 28. A pair of pins 28 extends through openings 135, 145, 155, 165 of the opposing flange sections of the collection trays. The pins 28 are configured to lift the bottom tray(s) 150, 160 off of a rest 29 and against the collection tray 140 to seal them against splashes, while still maintaining the chamber gap 34. The pins 28 are thus designed to hold the bottommost collection tray in contact with the others so as to provide a seal between the collection trays that are in contact with one another. As shown, the pin 28 includes a radial protrusion or the like at or near the bottom end (and also at or near the top end) which supports the bottommost tray.

Figure 4:
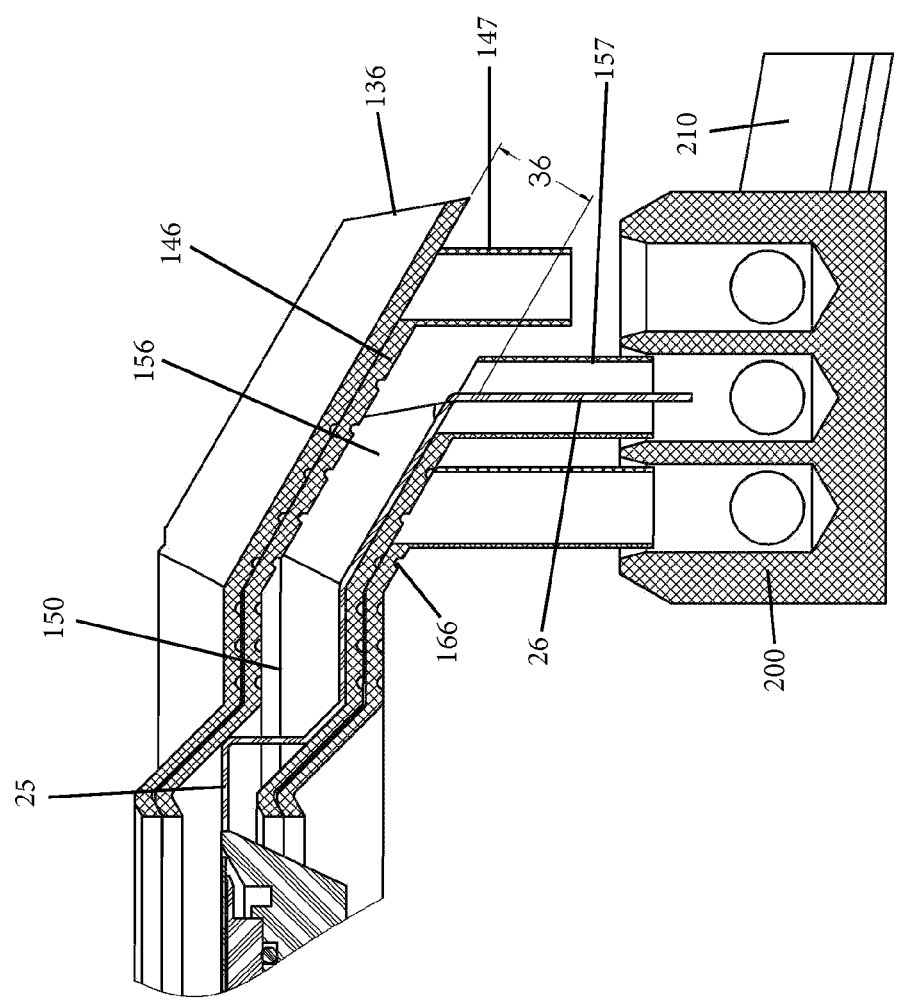
FIG. 4 shows a cross-section of the collection trays in a second fluid collection position.
Figure 9:
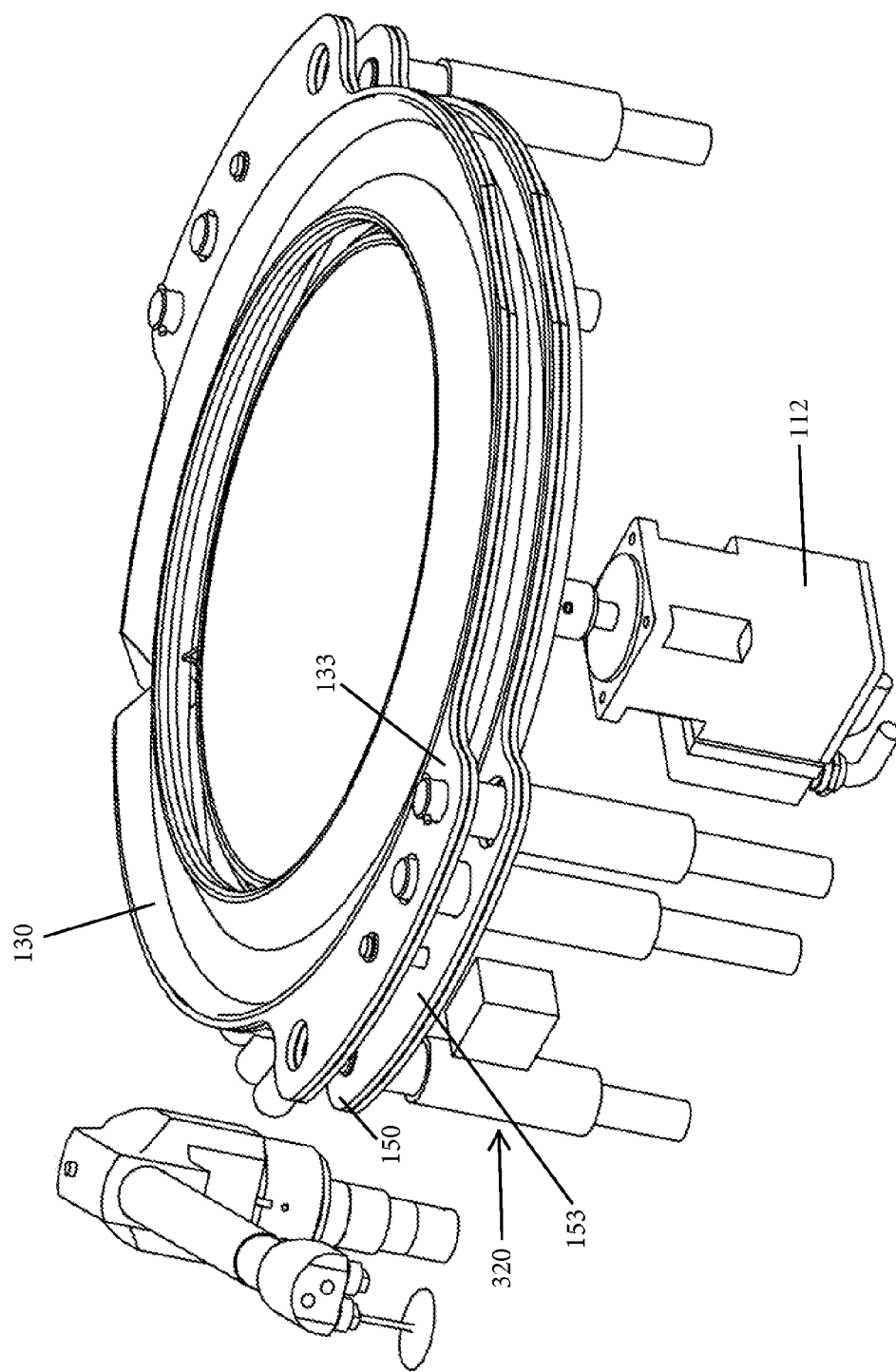
FIG. 9 is a perspective showing the apparatus in the second fluid collection position.

FIGS. 4 and 9 show the apparatus 100 with the trays 130, 140, 150, 160 forming a second collection chamber 36 (gap), positioned by a pair of pistons 310 (second pistons) in combination with the pair of pistons 300 (first pistons) which are also actuated and in their fully extended states. When the pistons 310 are actuated and move upwardly, the stepped construction of the pistons 310 is such that both the collection trays 130, 140 are supported by the first shoulder of the pistons 310 (resulting in the trays 130, 140 being in sealed contact with one another) and the trays 150, 160 seating against the second shoulder of the pistons 310. As shown the pistons 320 are not actuated. A second discrete fluid 26, flows through the chamber 36, following normal path 25 in which the fluid flows into the outlet port 156 and the fluid conduit member 157 and finally into the manifold 200. From there the fluid flows into the drain tube 210 and ends up in a discrete tank (not shown) for storage and reuse, where it is dispensed during the next wafer cycle.

Figure 5:
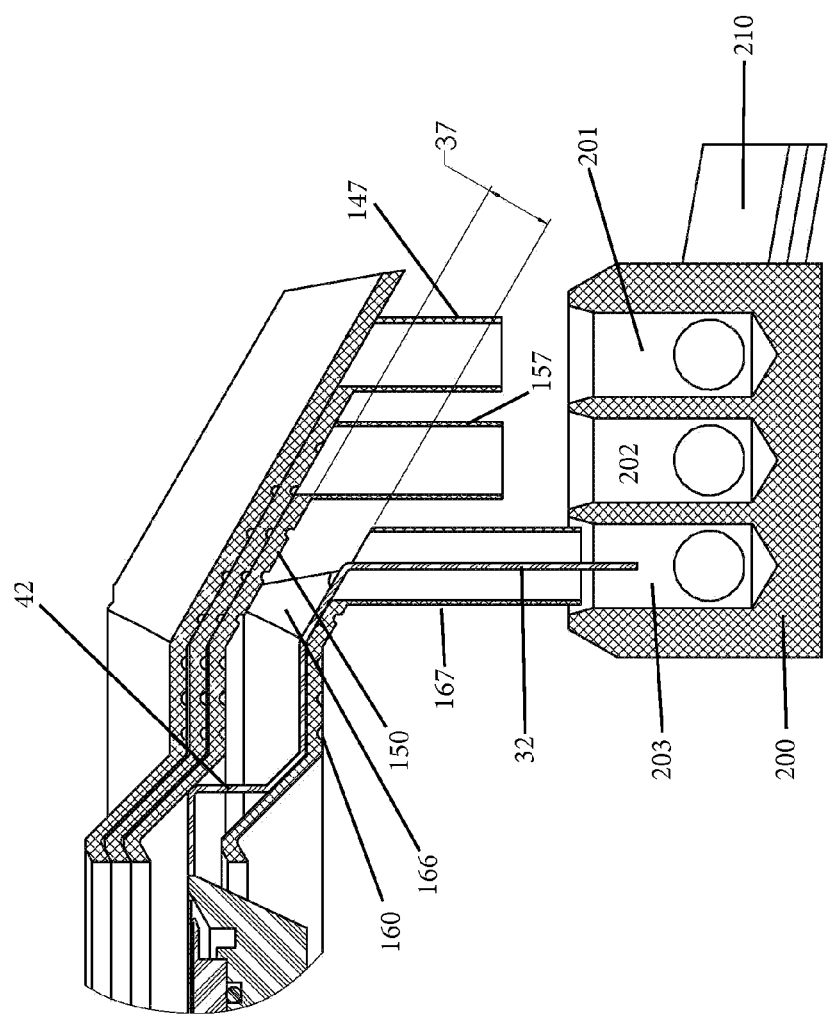
FIG. 5 shows a cross-section of the collection trays in a third fluid collection position.
Figure 10:
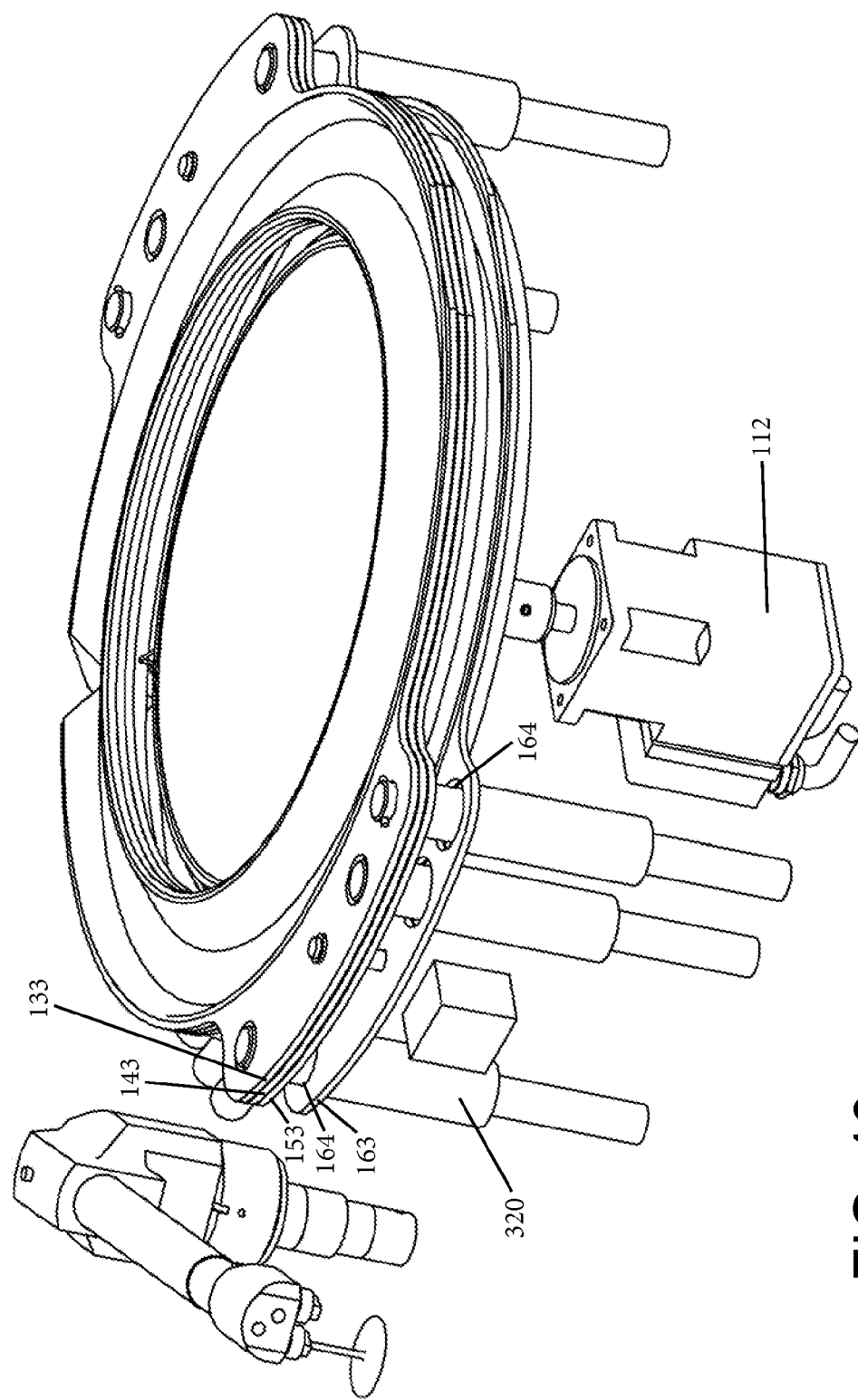
FIG. 10 is a perspective showing the apparatus in the third fluid collection position

FIGS. 5 and 10 show the apparatus 100 with the trays 130, 140, 150, 160 forming a third collection chamber 37, positioned by a piston pair 320 (third pistons) in combination with the pair of pistons 300, 310 (first and second pistons) which are also actuated and in their fully extended states. When the pistons 320 are actuated and move upward, the stepped construction of the pistons 320 is such that the collection trays 130, 140, 150 (the three uppermost trays) are supported by the first shoulder of the pistons 310 (resulting in the trays 130, 140, 150 being in sealed contact with one another) and the tray 160 (bottommost tray) seats against the second shoulder of the pistons 320. A third discrete fluid 32, flows through the collection chamber 37 following normal path 42 in which the fluid flows into the outlet port 166 and the fluid conduit member 167 and finally into the manifold 200. From there the fluid flows into the drain tube 210 and ends up in a discrete tank (not shown) for storage and reuse, where it is dispensed during the next wafer cycle.

The distance between the two collection trays that define one specific, selected collection chamber remains the same regardless of which two collection trays 130, 140, 150, 160 define such collection chamber. This is a result of the construction of the pistons (e.g., the shoulders formed therein) and controlled distance of the strokes thereof.

Figure 8:
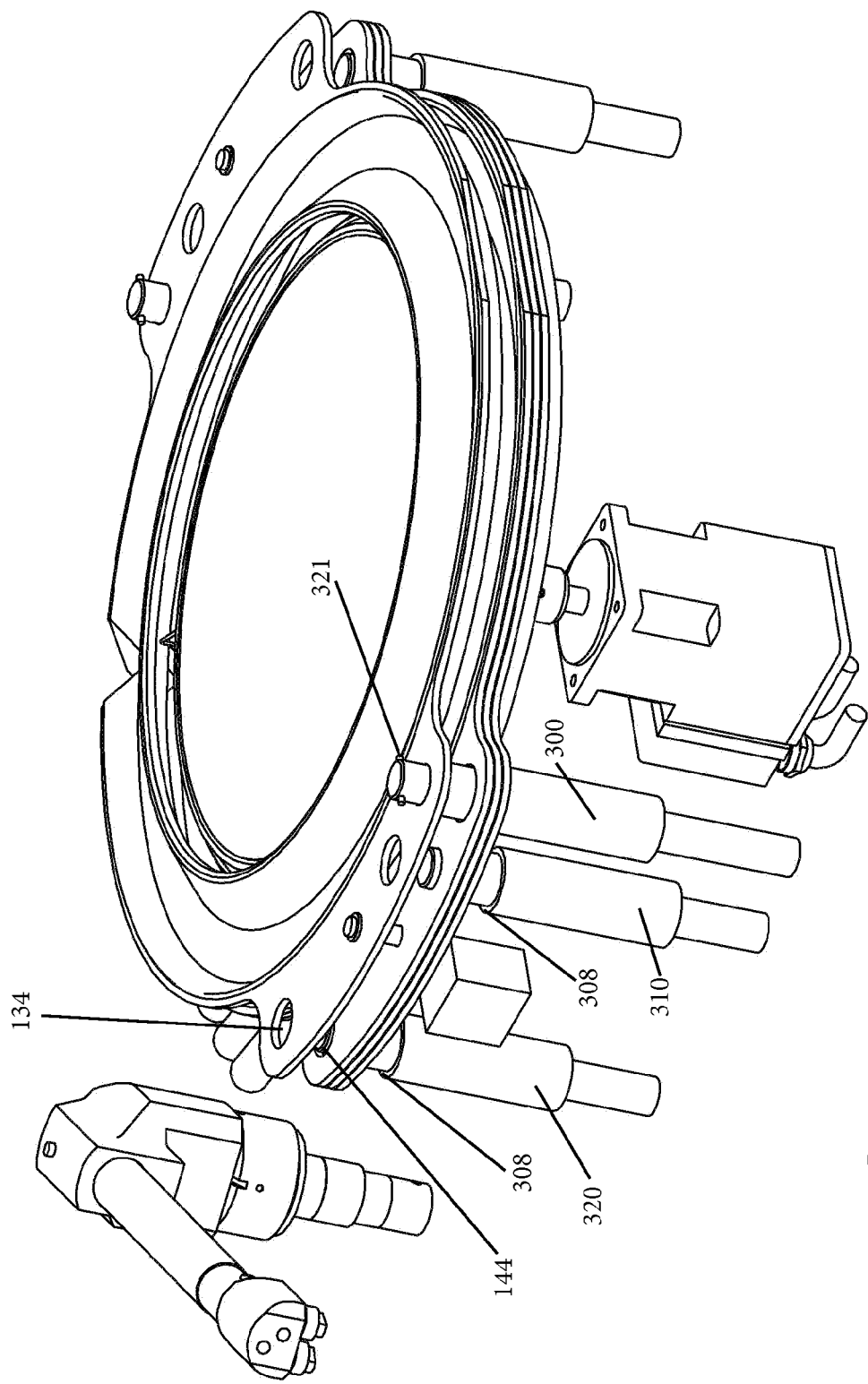
FIG. 8 is a perspective showing the apparatus in the first fluid collection position.

As shown in the FIGS. 8-10, the top end of each piston 300 can include a stop member 321 in the form of a protrusion to limit the movement of the collection tray 130 (the uppermost collection tray) in an upward direction. As will be understood, the most upward position of the collection tray 130 results in the collection tray 130 seating against this stop member 321. The stop members 321 thus assist in holding the collection tray assembly together.

Additional details and advantages of the present invention include but are not limited to: (1) the collection apparatus is able to collect multiple different fluids without cross contamination of each other, and directing each fluid into a separate drain; (2) it contains multiple collection trays which are determined by the number of fluids plus one; (3) the collection trays have the ability to stack into each other, preventing other fluids from splashing into them, thus eliminating cross contamination; (4) air cylinders with shoulders designed to vertically position and set the gap between two trays, thereby forming each collection chamber; (5) multiple drip grooves are designed into the underside of each tray, to direct fluid into the intended lower tray's drain; (6) when the collection trays are stacked together a gap is left between the upper and lower tray such that space is left for fluid that has yet to drain out of the tray, thereby preventing splashing of the fluid and (7) each fluid is discharged into a unique drain.

Referring again to FIGS. 1-10 and further to the above discussion, it will be appreciated that the collection chamber apparatus 100 includes a number of working components that are actuatable, as described below, in order to place the collection chamber apparatus 100 in different operating positions and more specifically, to create a defined collection chamber and a corresponding defined fluid flow path that allows collection of a liquid used in the wafer processing.

The collection chamber apparatus 100 includes a wafer support member 110 on which a wafer 115 is disposed during processing thereof. The wafer support member 110 is in the form of a rotatable wafer spin chuck. The spin chuck 110 is operatively connected to a motor 112 which is configured to rotate the spin chuck 110 at a selected speed (RPM). Operation of the spin chuck 110 is by traditional methods.

A fluid dispensing arm 120 represents a means for dispensing a fluid 119 onto the wafer 115. The fluid dispensing arm 120 can be any number of different types of traditional fluid dispensing members including the arm 120 shown in the figures. As described herein, during wafer processing, liquid is dispensed onto a surface of the wafer 115 and during rotation of the wafer 115, the fluid is propelled radially outward and off of the wafer 115 by centrifugal force.

In accordance with the present invention, the collection chamber assembly of the apparatus 100 is disposed circumferentially about the spin chuck 110 and thus, is disposed circumferentially about the wafer 115. As mentioned above, the collection chamber component comprises a plurality of collection trays that serve to not only collect the fluid being propelled radially outward off of the wafer 115 during the processing thereof but also routes the fluid to an outlet to facilitate collection of the fluid. In the illustrated embodiment, which is exemplary in nature, there are four different collection trays 130, 140, 150, 160 that are arranged in a stacked configuration. However, it will be understood that less than or more than four collection trays can be used in the apparatus 100. It will be appreciated that the addition of one collection tray results in a corresponding addition of a distinct collection chamber for collecting a fluid. This aspect will be readily understood from the below discussion and from the drawing figures.

The collection trays 130, 140, 150, 160 can have the same or similar basic design as shown in the figures. In the illustrated embodiment, the collection tray 130 is generally annular shaped with a center opening 131 that receives the spin chuck 110 and the wafer 115. The collection tray 130 has a main section that defines an annular shaped collection track 132 which is defined by a floor and a pair of beveled side walls that are adjacent and slope up from the floor. Alternative floor design is equally possible and the illustrated design is only exemplary in nature.

As shown in FIG. 1, the collection tray 130 also has a pair of outwardly extending flange sections 133. The flange sections 133 are preferably located opposite one another (e.g., 180 degrees apart) and have a plurality of openings 134 formed therein. The openings 134 are spaced along the flange section between the side walls thereof. In the illustrated embodiment, there are three openings 134 that receive working pistons (e.g., ends of pneumatic (air) cylinders) as described below. There is also an additional opening 135 formed in each flange section 133. The openings 134, 135 can be arranged such that the two openings 134 are adjacent one another and the third opening 134 is spaced from this pair of openings 134 with the opening 135 being disposed between the pair of openings 134 and the spaced third opening 134.

The collection tray 130 also includes an outlet port 136 which is in fluid communication with the fluid collection track 132. The outlet port 136 can be in the form of a spout that extends radially outward from the main section between the flange sections 133. In the illustrated embodiment, the outlet port 136 is generally V-shaped and extends outward from the main section and thus provides a trough along which the collected fluid flows. The bottom of the outlet port 136 is in fluid communication with the bottom (floor) of the fluid collection track 132 and thus fluid can flow from the fluid collection track 132 into the outlet port 136. As will be described below, the outlet port of each collection tray is in fluid communication with the manifold structure 200 to route the collected fluid.

The collection tray 140 is similar to the collection tray 130 and is generally annular shaped with a center opening 141 that receives the spin chuck 110 and the wafer 115. The collection tray 140 has a main section that defines an annular shaped collection track 142 which is defined by a floor and a pair of beveled side walls that are adjacent and slope up from the floor.

The collection tray 140 also has a pair of outwardly extending flange sections 143. The flange sections 143 are preferably located opposite one another (e.g., 180 degrees apart) and have a plurality of openings 144 formed therein. The openings 144 are spaced along the flange section between the side walls thereof. In the illustrated embodiment, there are three openings 144 that receive working pistons (e.g., ends of pneumatic (air) cylinders) as described below. There is also an additional opening 145 formed in each flange section 143. The openings 144, 145 can be arranged such that the two openings 144 are adjacent one another and the third opening 144 is spaced from this pair of openings 144 with the opening 145 being disposed between the pair of openings 144 and the spaced third opening 144.

The collection tray 140 also includes an outlet port 146 which is in fluid communication with the fluid collection track 142. The outlet port 146 can be in the form of a spout that extends radially outward from the main section between the flange sections 143. In the illustrated embodiment, the outlet port 146 is generally V-shaped and extends outward from the main section and thus provides a trough along which the collected fluid flows. The bottom of the outlet port 146 is in fluid communication with the bottom (floor) of the fluid collection track 142 and thus fluid can flow from the fluid collection track 142 into the outlet port 146.

The collection tray 150 is similar to the other collection trays and is generally annular shaped with a center opening 151 that receives the spin chuck 110 and the wafer 115. The collection tray 150 has a main section that defines an annular shaped collection track 152 which is defined by a floor and a pair of beveled side walls that are adjacent and slope up from the floor.

The collection tray 150 also has a pair of outwardly extending flange sections 153. The flange sections 153 are preferably located opposite one another (e.g., 180 degrees apart) and have a plurality of openings 154 formed therein. The openings 154 are spaced along the flange section between the side walls thereof. In the illustrated embodiment, there are three openings 154 that receive working pistons (e.g., ends of pneumatic (air) cylinders) as described below. There is also an additional opening 155 formed in each flange section 153. The openings 154, 155 can be arranged such that the two openings 154 are adjacent one another and the third opening 154 is spaced from this pair of openings 154 with the opening 155 being disposed between the pair of openings 154 and the spaced third opening 154.

The collection tray 150 also includes an outlet port 156 which is in fluid communication with the fluid collection track 152. The outlet port 156 can be in the form of a spout that extends radially outward from the main section between the flange sections 153. In the illustrated embodiment, the outlet port 156 is generally V-shaped and extends outward from the main section and thus provides a trough along which the collected fluid flows. The bottom of the outlet port 156 is in fluid communication with the bottom (floor) of the fluid collection track 152 and thus fluid can flow from the fluid collection track 152 into the outlet port 156.

The collection tray 160 is generally annular shaped with a center opening 161 that receives the spin chuck 110 and the wafer 115. The collection tray 160 has a main section that defines an annular shaped collection track 162 which is defined by a floor and a pair of beveled side walls that are adjacent and slope up from the floor.

The collection tray 160 also has a pair of outwardly extending flange sections 163. The flange sections 163 are preferably located opposite one another (e.g., 180 degrees apart) and have a plurality of openings 164 formed therein. The openings 164 are spaced along the flange section between the side walls thereof. In the illustrated embodiment, there are three openings 164 that receive working pistons (e.g., ends of pneumatic (air) cylinders) as described below. There is also an additional opening 165 formed in each flange section 163. The openings 164, 165 can be arranged such that the two openings 164 are adjacent one another and the third opening 164 is spaced from this pair of openings 164 with the opening 165 being disposed between the pair of openings 164 and the spaced third opening 164.

The collection tray 160 also includes an outlet port 166 which is in fluid communication with the fluid collection track 162. The outlet port 166 can be in the form of a spout that extends radially outward from the main section between the flange sections 163. In the illustrated embodiment, the outlet port 166 is generally V-shaped and extends outward from the main section and thus provides a trough along which the collected fluid flows. The bottom of the outlet port 166 is in fluid communication with the bottom (floor) of the fluid collection track 162 and thus fluid can flow from the fluid collection track 162 into the outlet port 166.

As mentioned above, the collection trays 130, 140, 150, 160 are arranged in a stacked configuration and thus the respective flange sections are stacked on top of each other and are configured to mate with one another and the respective outlet ports are disposed on top of one another as shown.

The outlet ports 136, 146, 156, 166 thus resemble angled troughs/spouts which permit fluid to flow downward by gravity. As best shown in FIGS. 3A and 3B, each of the outlet ports 146, 156, and 166 includes a fluid conduit member 147, 157, 167, respectively, which descends downwardly therefrom. As shown, each of the fluid conduit members 147, 157, 167 can be in the form of a tubular structure that communicates at a top open end with the bottom of the respective outlet port. The fluid conduit members 147, 157, 167 can be vertically oriented and thus, fluid flows by gravity from the respective outlet port into the fluid conduit member to a separation manifold 200. As shown in FIGS. 4 and 5, the fluid conduit members 147, 157, 167 are slidingly received within respective inlet ports 201, 202, 203 of the manifold to establish a fluid connection. The manifold 200 includes a drain tube 210 which is in fluid communication with each of the fluid conduit members and thus, fluid flowing through the fluid conduit member flows into the manifold and into the drain tube 210. The drain tube 210 routes the fluid to a predetermined location such as a location at which a collection tank is provided for collecting the fluid.

The collection aspect of the apparatus 100 is based on the fact that the individual collection trays 130, 140, 150, 160 can each be moved to a predetermined position so as to define a discrete collection chamber that is configured to collect the fluid that is propelled outwardly off of the wafer during processing. It will be appreciated that different means for moving the collection trays can be used and the ones described herein are merely exemplary in nature. In the illustrated embodiment, pneumatic devices are used to control the movement of the trays and in particular, pistons in the form of air cylinders are used. To move the multiple (e.g., 4) collection trays, there are multiple pistons and in particular and according to one embodiment, when the apparatus includes n number of collection trays, there are 2*(n−1) number of pistons. Further, it will be appreciated that each tray can be moved by one or more piston and thus, while the illustrated embodiment shows pistons being arranged in pairs, other variations are equally possible. For example, sets of three pistons can be used instead to move the collection trays. To provide the proper support, it is desired that there be at least two pistons for moving a respective collection tray (e.g., as mentioned, there can be three or more pistons used per collection tray).

As shown, there is a pair of first pistons 300, a pair of second pistons 310, and a pair of third pistons 320. The pistons 300, 310, 320 are arranged below the flange sections of the collection trays and are axially aligned with select ones of the openings 134, 144, 154, 164. The openings 134, 144, 154, 164 are axially aligned with one another and differ in only dimensions (i.e., diameters thereof), thereby allow at least a portion of the piston to pass through select openings. Each piston 300, 310, 320 includes a stepped construction so as to create select interference with the tray so as to effectuate a lifting of a select tray.

For the purpose of illustration and as described below, the pair of first pistons 300 is designed to lift the collection trays 130, 140; the pair of second pistons 310 is designed to lift the collection trays 140, 150 and the pair of third piston 320 is designed to lift the collection trays 150, 160. In other words, each pair of pistons is designed to lift two collection trays; however, in combination with other pairs of pistons being actuated, more than two collection trays are moved.

As shown best in FIG. 6, the stepped construction of the first piston 300 is defined by a first shoulder 307 and a second shoulder 308. The outer diameter of the second shoulder 308 is greater than the first shoulder 307. The piston 300 thus has a variable diameter and in particular, includes a first region between the first shoulder 307 and top end that has a first outer diameter; a second region between the two shoulders that has a second outer diameter and a third region below the second shoulder 308 that a third diameter, wherein the first outer diameter<second outer diameter<third outer diameter. The openings 134, 144, 154, 164 are purposely sized so that only one or more of the regions is free to pass therethrough and the shoulders 307, 308 create lifting surface for lifting select collection trays.

Figure 7:
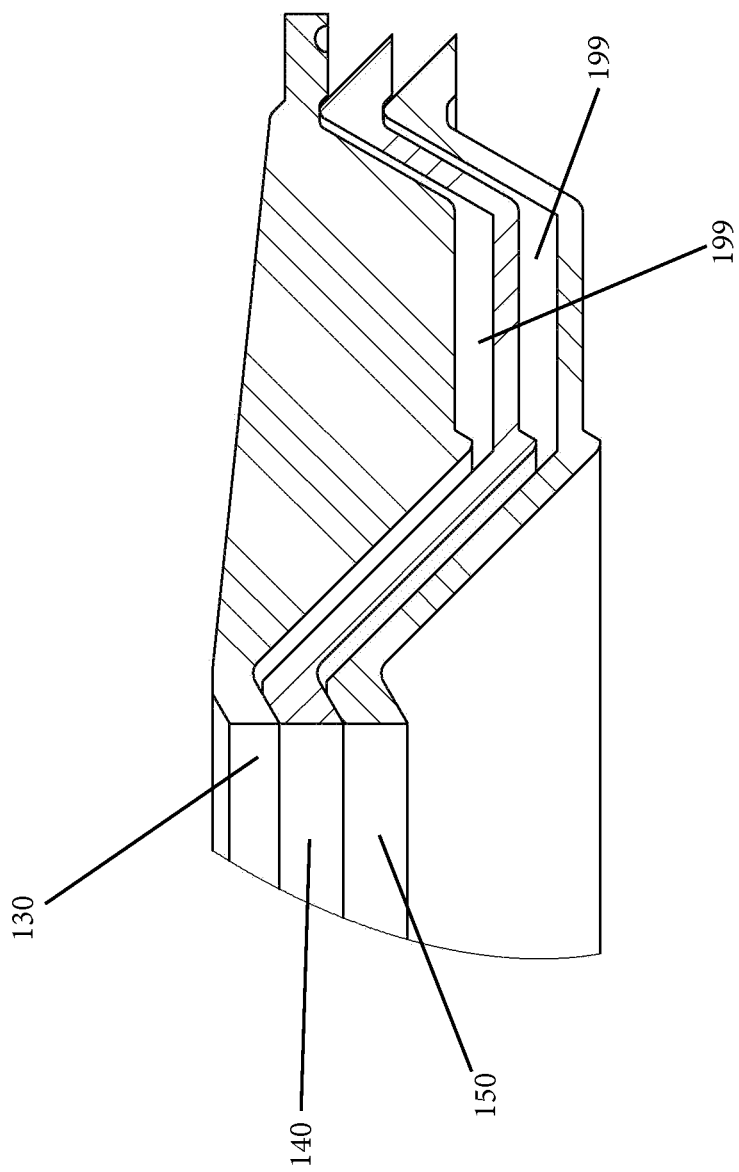
FIG. 7 is close-up cross-sectional view of stacked collection trays which include cavities left between the collection trays to reduce fluid splashing when the collection trays are closed.

As shown in FIG. 7, the collections trays are configured to include an anti-splash feature. More specifically, a fluid reservoir 199 is formed between adjacent closed collection trays to reduce fluid splashing when the collection trays are closed. More particularly, the underside of one collection tray and the topside of the collection tray immediately beneath it leave the fluid reservoir 199 between them when the two trays are collapsed. The fluid reservoir prevents fluid from being squeezed or splashed out from between the trays when the trays are closed. FIG. 7 shows collections trays 130, 140, 150 in closed positions, with one fluid reservoir 199 being formed between the collection trays 130, 140 and another fluid reservoir 199 being formed between the collection trays 140, 150.

While the invention has been described in connection with certain embodiments thereof, the invention is capable of being practiced in other forms and using other materials and structures. Accordingly, the invention is defined by the recitations in the claims appended hereto and equivalents thereof.

What is claimed is:

1. A wafer processing system including a fluid collection apparatus configured to separate and collect multiple fluids for reuse during wafer processing comprising:
   a rotatable wafer support member for supporting a wafer;
   a plurality of collections trays disposed about a peripheral edge of the wafer support member, the collection trays being arranged in a stacked configuration, each collection tray having a track section for collecting fluid and an outlet in fluid communication with the track section for discharging the collected fluid; and
   a means for selectively and independently moving one or more of the collection trays to an elevated position above the wafer support member so as to define a collection chamber formed between at least two of the collection trays, the collection chamber being configured to collect fluid that is discharged from the wafer during the processing thereof and routes the collected fluid through the outlet of one of the collection trays, wherein the track sections of the associated collection trays are likewise independently movable with respect to one another, wherein in a nested position, two or more adjacent collection trays are in direct contact with one another, wherein the track section of one collection tray is received within and is in direct contact with the track section of the immediately adjacent collection tray.

2. The wafer processing system of claim 1, wherein the means comprises at least a first pair of pistons disposed below the collection trays, each piston being movable between a retracted position in which all of the collection trays are in intimate contact with one another and an extended position in which at least two collections trays are moved to the elevated position and the collection chamber is formed therebetween.

3. The wafer processing system of claim 2, wherein the collections trays are stacked in a vertical manner with one entire collection tray being disposed above another entire collection tray, wherein each and every collection chamber is defined between an underside of one collection tray and an upper surface of another collection tray that is disposed immediately below of the one collection tray.

4. The wafer processing system of claim 3, wherein each piston passes through respective openings formed in each of the collection trays and each piston has a stepped construction at one end so as to define first and second shoulders, wherein in the extended position of the pistons, the first collection tray is supported by the first shoulder and the second collection tray is supported by the second shoulder, wherein the first and second shoulders are formed a prescribed distance apart so as to create the collection chamber which has a prescribed height.

5. The wafer processing system of claim 4, further including a third collection tray disposed below the second collection tray and a second pair of pistons, whereby actuation of the second pair of pistons in combination with actuation of the first pair of pistons defines a second collection chamber between an underside of the second collection tray and an upper surface of the third collection tray, each piston of the second pair having a stepped construction at one end so as to define first and second shoulders, wherein in the extended position of the pistons, the first and second collection trays are supported by the first shoulder and the third collection tray is supported by the second shoulder, wherein the first and second shoulders are formed a prescribed distance apart so as to create the second collection chamber which has a prescribed height.

6. The wafer processing system of claim 5, further including a fourth collection tray disposed below the third collection tray and a third pair of pistons, whereby actuation of the third pair of pistons in combination with actuation of the first and second pairs of pistons defines a third collection chamber between an underside of the third collection tray and an upper surface of the fourth collection tray, each piston of the third pair having a stepped construction at one end so as to define first and second shoulders, wherein in the extended position of the pistons, the first, second and third collection trays are supported by the first shoulder and the fourth collection tray is supported by the second shoulder, wherein the first and second shoulders are formed a prescribed distance apart so as to create the third collection chamber which has a prescribed height.

7. The wafer processing system of claim 1, wherein the outlet comprises a spout that is formed at a downward angle to allow the discharge fluid to flow by gravity to a collection location, the sprout being integral to the track section and extending radially outward therefrom.

8. The wafer processing system of claim 7, wherein the spout is defined by a recessed surface and the outlet further includes a vertical conduit that is in fluid communication with and integral to the spout to route the discharged fluid from the spout to the inside of a vertical conduit.

9. The wafer processing system of claim 1, wherein an underside of at least one collection tray includes multiple drip grooves to direct the discharged fluid into the outlet.

10. The wafer processing system of claim 2, wherein each collection tray includes a pair of flanges that extend radially outward and are disposed opposite one another, the pair of pistons being located below the flanges and opposite one another, each flange being formed above a floor of the track section.

11. The wafer processing system of claim 1, wherein the underside of one collection tray and the topside of the collection tray immediately beneath form a fluid reservoir between them when the two trays are collapsed.

12. The wafer processing system of claim 11, wherein the fluid reservoir prevents fluid from being squeezed or splashed out from between the trays when the trays are closed.

13. The wafer processing system of claim 1, wherein the plurality of collection trays comprises at least three collection trays and wherein the rotatable wafer support is operatively coupled to a motor to allow controlled rotation of the wafer support, the fluid being discharged from the wafer as a result of centrifugal force generated by rotation of the wafer support as the fluid is dispensed along an upper surface of the wafer during processing thereof.

14. A fluid collection apparatus configured to separate and collect multiple fluids for reuse during wafer processing comprising:
   a plurality of collections trays for placement about a peripheral edge of a wafer support member, the collection trays being arranged in a stacked configuration, each collection tray having an integral recessed track section for collecting fluid generated during wafer processing and an outlet in fluid communication with the track section for discharging the collected fluid, wherein the integral recessed track sections are disposed in a vertically stacked orientation and are configured to intimately nest with one another and move independently, wherein in a nested position between two adjacent collection trays, the two adjacent collection trays directly contact one another with innermost radial portions of the two adjacent collection trays directly seating against one another; and
   at least one piston for moving one or more of the collection trays to an elevated position above the wafer support member so as to define a collection chamber fanned between at least two of the collection trays, the collection chamber being configured to collect fluid that is discharged from the wafer during the processing thereof and routes the collected fluid through the outlet of one of the collection trays.

15. The fluid collection apparatus of claim 12, wherein there is at least a first pair of pistons disposed below the collection trays, each piston being movable between a retracted position in which all of the collection trays are in intimate contact with one another and an extended position in which at least two collections trays are moved to the elevated position and the collection chamber is formed therebetween.

16. The fluid collection apparatus of claim 13, wherein the collection chamber is defined between an underside of a first collection tray and an upper surface of a second collection tray that is disposed immediately below of the first collection tray.

17. The fluid collection apparatus of claim 14, wherein the pistons pass through openings formed in the collection trays and each piston has a stepped construction at one end so as to define first and second shoulders, wherein in the extended position of the pistons, the first collection tray is supported by the first shoulder and the second collection tray is supported by the second shoulder, wherein the first and second shoulders are formed a prescribed distance apart so as to create the collection chamber which has a prescribed height.

18. The fluid collection apparatus of claim 15, further including a third collection tray disposed below the second collection tray and a second pair of pistons, whereby actuation of the second pair of pistons in combination with actuation of the first pair of pistons defines a second collection chamber between an underside of the second collection tray and an upper surface of the third collection tray, each piston of the second pair having a stepped construction at one end so as to define first and second shoulders, wherein in the extended position of the pistons, the first and second collection trays are supported by the first shoulder and the third collection tray is supported by the second shoulder, wherein the first and second shoulders are formed a prescribed distance apart so as to create the second collection chamber which has a prescribed height.

19. The fluid collection apparatus of claim 16, further including a fourth collection tray disposed below the third collection tray and a third pair of pistons, whereby actuation of the third pair of pistons in combination with actuation of the first and second pairs of pistons defines a third collection chamber between an underside of the third collection tray and an upper surface of the fourth collection tray, each piston of the third pair having a stepped construction at one end so as to define first and second shoulders, wherein in the extended position of the pistons, the first, second and third collection trays are supported by the first shoulder and the fourth collection tray is supported by the second shoulder, wherein the first and second shoulders are formed a prescribed distance apart so as to create the third collection chamber which has a prescribed height.

20. The fluid collection apparatus of claim 12, wherein the outlet comprises a spout that is formed at a downward angle to allow the discharge fluid to flow by gravity to a collection location, the sprout being integral to the track section and extending radially outward therefrom.

21. The fluid collection apparatus of claim 18, wherein the spout is defined by a recessed surface and the outlet further includes a vertical conduit that is in fluid communication with and integral to the spout to route the discharged fluid from the spout to the inside of a vertical conduit.

22. The fluid collection apparatus of claim 12, wherein an underside of at least one collection tray includes multiple drip grooves to direct the discharged fluid into the outlet.

23. The fluid collection apparatus of claim 13, wherein each collection tray includes a pair of flanges that extend radially outward and are disposed opposite one another, the pair of pistons being located below the flanges and opposite one another, each flange being formed above a floor of the track section.

24. The fluid collection apparatus of claim 12, wherein the rotatable wafer support is operatively coupled to a motor to allow controlled rotation of the wafer support, the fluid being discharged from the wafer as a result of centrifugal force generated by rotation of the wafer support as the fluid is dispensed along an upper surface of the wafer during processing thereof.

25. The fluid collection apparatus of claim 1, wherein the collection trays are arranged in a vertically stacked configuration.

26. The fluid collection apparatus of claim 14, wherein each outlet is in fluid communication with a fluid conduit member and a single manifold receives the plural fluid conduit members for routing the discharged fluid to a drain location.

27. The fluid collection apparatus of claim 7, wherein the spouts of the plurality of collection trays have different radial lengths, with a bottommost collection tray having the shortest radial length and a topmost collection tray having the longest radial length.

28. The fluid collection apparatus of claim 1, wherein each track section is defined by a radial inner angled wall and a radial outer angled wall with a floor defined therebetween.

29. A fluid collection apparatus configured to separate and collect multiple fluids for reuse during wafer processing comprising:
   a plurality of collections trays for placement about a peripheral edge of a wafer support member, the collection trays being arranged in a vertically stacked configuration, each collection tray having an integral recessed track section for collecting fluid generated during wafer processing and an outlet in fluid communication with the track section for discharging the collected fluid, wherein the integral recessed track sections are disposed in a vertically stacked orientation and are configured to intimately nest with one another and move independently, each track section being defined by a radial inner angled wall that terminates in an innermost radial portion and a radial outer angled wall with a floor defined therebetween, wherein in a nested position between two adjacent collection trays, the two adjacent collection trays directly contact one another with the innermost radial portions of the two adjacent collection trays directly seating against one another; and
   at least one piston for moving one or more of the collection trays to an elevated position above the wafer support member so as to define a collection chamber formed between at least two of the collection trays, the collection chamber being configured to collect fluid that is discharged from the wafer during the processing thereof and routes the collected fluid through the outlet of one of the collection trays, wherein the seating of the innermost radial portions of the two adjacent collection trays in the nest position prevents any collection chamber from being formed therebetween.

* * * * *